(12) United States Patent
Chao

(10) Patent No.: US 10,848,063 B2
(45) Date of Patent: Nov. 24, 2020

(54) CONVERTER TECHNIQUES FOR SINKING AND SOURCING CURRENT

(71) Applicant: Analog Devices International Unlimited Company, Limerick (IE)

(72) Inventor: Hio Leong Chao, Tempe, AZ (US)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/245,818

(22) Filed: Jan. 11, 2019

(65) Prior Publication Data
US 2020/0228013 A1 Jul. 16, 2020

(51) Int. Cl.
| | |
|---|---|
| H02M 3/158 | (2006.01) |
| H03K 17/16 | (2006.01) |
| H02M 1/38 | (2007.01) |
| H02M 3/335 | (2006.01) |

(52) U.S. Cl.
CPC ........... *H02M 3/1582* (2013.01); *H02M 1/38* (2013.01); *H02M 3/1588* (2013.01); *H02M 3/33592* (2013.01); *H03K 17/165* (2013.01)

(58) Field of Classification Search
None
See application file for complete search history.

(56) References Cited

U.S. PATENT DOCUMENTS

| | | | |
|---|---|---|---|
| 6,396,250 B1 | 5/2002 | Bridge | |
| 7,868,597 B2 | 1/2011 | Dequina | |
| 2004/0189269 A1 | 9/2004 | Lynch | |
| 2005/0128776 A1* | 6/2005 | Dequina | H02M 1/088 363/89 |
| 2005/0180068 A1* | 8/2005 | Lopata | G06F 1/263 361/18 |
| 2009/0027020 A1* | 1/2009 | Qiu | H02M 3/1588 323/282 |
| 2012/0140526 A1* | 6/2012 | Martinelli | H02J 7/35 363/21.06 |
| 2013/0271056 A1* | 10/2013 | Bunte | F03D 7/0224 318/503 |
| 2018/0116019 A1* | 4/2018 | Eggermont | H02M 1/088 |
| 2019/0157970 A1* | 5/2019 | Lee | H02M 1/32 |

* cited by examiner

*Primary Examiner* — Jeffrey A Gblende
(74) *Attorney, Agent, or Firm* — Schwegman Lundberg & Woessner, P.A.

(57) ABSTRACT

Techniques for a sinking and sourcing power stage are provided. In an example, a power stage circuit can include a first power transistor configured to couple to a first input power rail, a second power transistor configured to couple to a second input power rail, an output node configured to couple to a load and to couple the first power transistor in series with the second power transistor between the first and second input power rails, and a controller configured to operate the first and second power transistors in a first mode to source current to the load and to operate the first and second power transistors in a second mode to sink current from the load.

20 Claims, 11 Drawing Sheets

_US 10,848,063 B2_

CONVERTER TECHNIQUES FOR SINKING AND SOURCING CURRENT

TECHNICAL FIELD OF THE DISCLOSURE

The present subject matter discusses voltage converters, and more particularly, techniques for changing between operating modes of a voltage converter.

BACKGROUND

Buck converters have been recognized for efficiently stepping down voltage from an input supply for use by a load connected to an output of the buck converter. Synchronous buck converters can sink current from, or source current to, the output. However, various situations, such as when a current limit is violated, results in the buck converter operating with a forward biased body diode of one of the switches. Such operation can limit the efficiency of the buck converter.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventor has recognized improved techniques for operating a synchronous buck converter. In certain examples, the techniques can include switching an operating mode of the buck converter when a current limit threshold is detected. The mode change can assist in more efficiently operating the buck converter. In some examples, the techniques include detecting a forward bias of a body diode of a switch of the buck converter and commanding that switch to a low impedance mode to more efficiently conduct current. In certain examples, the techniques discussed herein can allow for more efficient and reliable performance of a monolithic buck converter. A monolithic buck converter can provide a power stage that can receive a pulse width modulated (PWM) signal, alternately switch a first and second power switches of the buck converter according to the PWM signal to provide a desired output voltage or current. In addition, the monolithic buck converter can be a single semiconductor chip that includes the power switches, sensors and controller to provide the techniques highlighted above. In certain examples, a monolithic buck converter according to the present subject matter can be used to differentially power a load, such as, but not limited to, a motor such as a stepper motor, or a thermoelectric device.

Figure 1A:
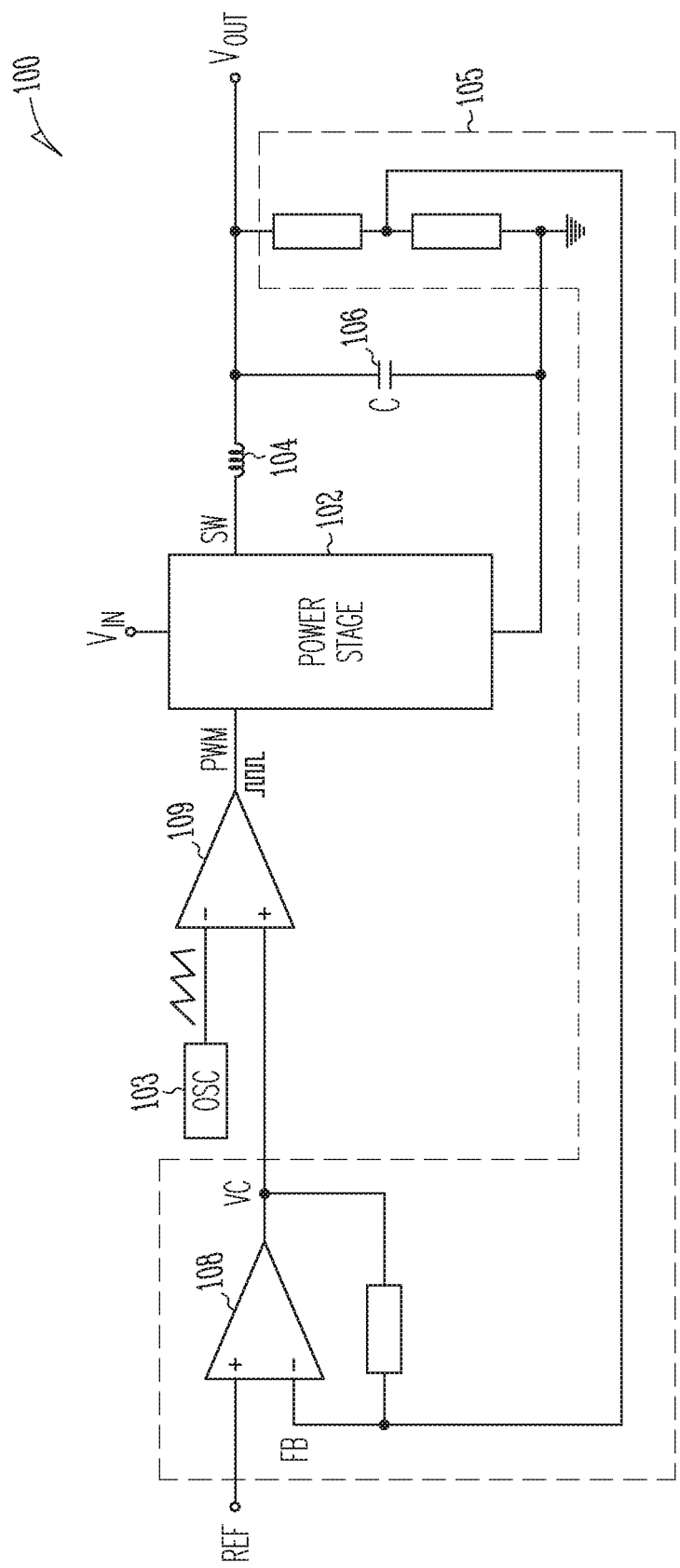
FIGS. 1A and 1B illustrate generally buck converters having an example power stage according to the present subject matter.
Figure 1B:
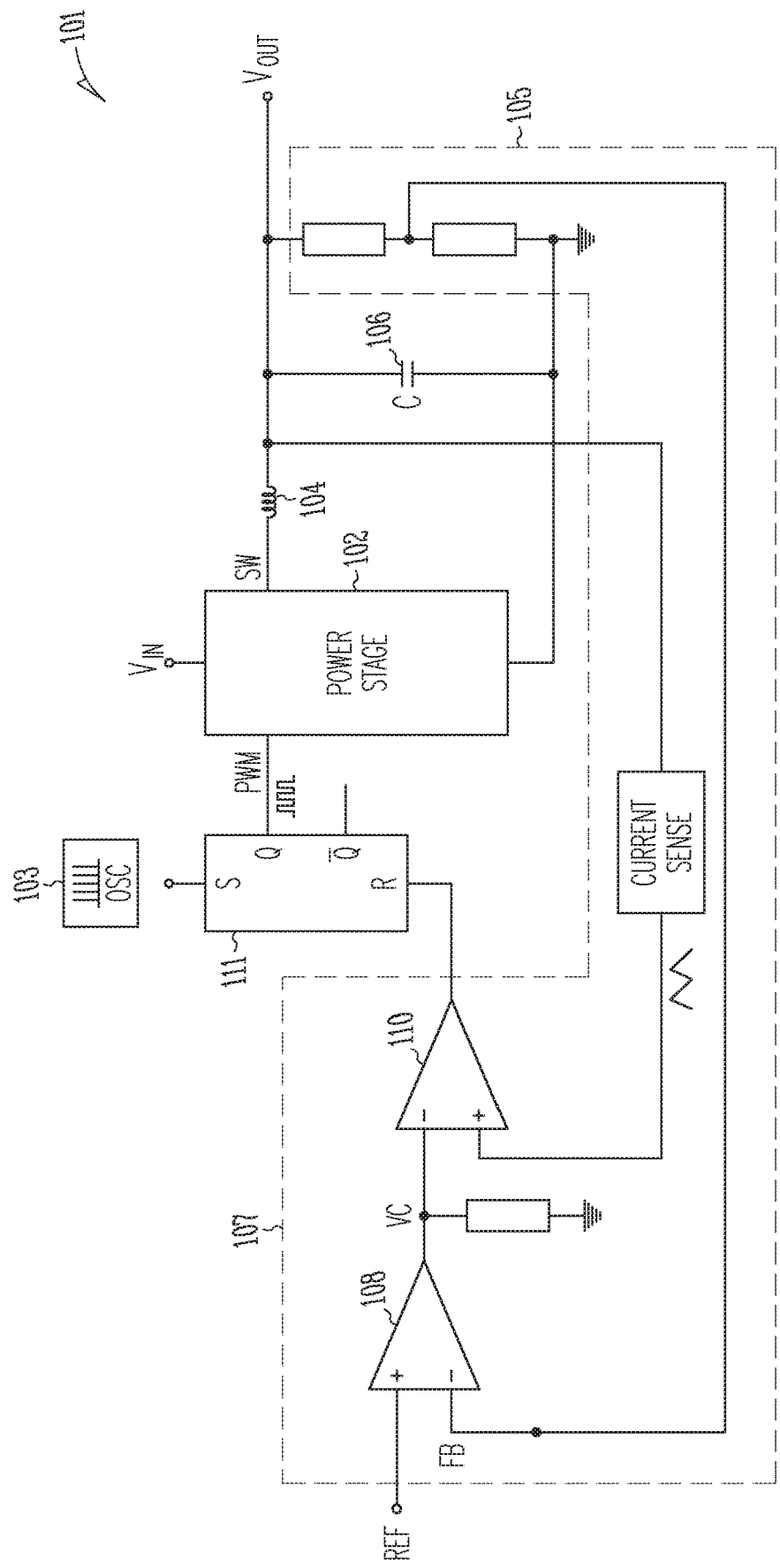

FIGS. 1A and 1B illustrate generally buck converters 100, 101 having an example power stage 102 according to the present subject matter. The voltage converters 100, 101 can include an oscillator 103, the power stage 102, an inductor 104, a feedback circuit 105, 107, an output capacitor 106. The voltage converter 100 of FIG. 1A includes single loop in the feedback circuit 105. The single loop provides a representation of the output voltage ($V_{OUT}$) of the converter to an error amplifier 108. The error amplifier 108 can compare the representation of the output voltage ($V_{OUT}$) with an input reference ($V_{REF}$) indicative of a desired output voltage ($V_{OUT}$), and can provide voltage error information. A second amplifier 109 can compare the voltage error information to a ramp signal of the oscillator 103 to provide the example power stage 102 with a PWM signal (PWM).

The voltage converter 101 of FIG. 1B includes a second loop in the feedback circuit 107. The first loop provides a representation of the output voltage ($V_{OUT}$) of the converter 101 to an error amplifier 108. The error amplifier 108 can compare the representation of the output voltage ($V_{OUT}$) with an input reference ($V_{REF}$) indicative of a desired output voltage ($V_{OUT}$) and can provide voltage error information. The second loop can provide a representation of the inductor current of the voltage converter 101 and a second amplifier 110 can compare the voltage error with the representation of the inductor current to provide a reset output for a flip-flop 111 or latch, such as a set-reset (SR) latch. The flip-flop 111 can generate a PWM signal for the power stage 102 and the oscillator 103 can provide the set signal for the flip-flop 111.

As discussed above, the example power stage 102 can provide the power switches and logic to respond to the PWM signal and can also efficiently handle detection and amelioration of body diode conduction, as well as, over-current limits of the power switches. In certain examples, a first mode of operation of the power stage 102 can include triggering a first switch of the power stage on a transition of the PWM signal and using the second switch as a rectifier. A second mode of the power stage can trigger the second switch of the power stage 102 on a transition of the PWM signal and can use the first switch as a rectifier. The controller of the power stage can control transitions between the modes of operation. In certain examples, a transition between the modes of operation can be based on the flow of current to or from the output of the voltage converter as discussed below.

Figure 2:
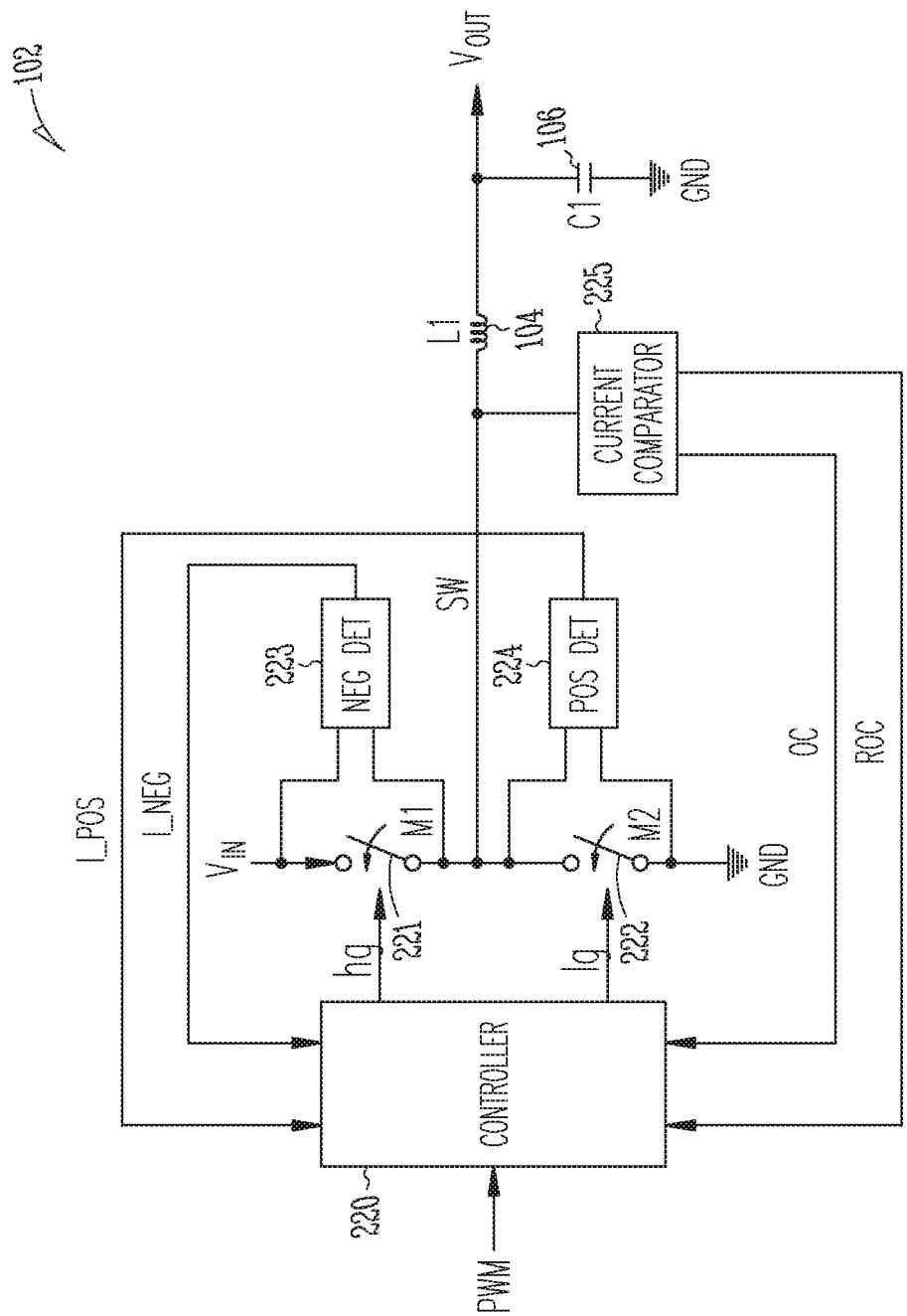
FIG. 2 illustrates generally a more detailed view of the example power stage.

FIG. 2 illustrates generally a more detailed view of the example power stage 102. In certain examples, the power stage 102 can include a controller 220, a first power switch 221, a second power switch 222, first and second body diode conduction sensors 223, 224, and a current comparator 225. The first switch 221 can be coupled between a first power supply rail ($V_{IN}$) and an output node (SW). The second power switch 222 can be coupled between the output node (SW) and a second power supply rail (GND). The output node (SW) can be coupled to the inductor 104 of a converter. The first body diode conduction sensor 223 can be mounted across the conduction nodes of the first power switch 221 and can provide an indication when the voltage at the output node (SW) is higher than the voltage at the first power supply rail ($V_{IN}$) by a first offset such as just less than the forward bias voltage of the body diode of the first power switch 221. The second body diode conduction sensor 224 can be mounted across the conduction nodes of the second power switch 222 and can provide an indication when the voltage at the output node (SW) is lower than the voltage at the second power supply rail (GND) by a second offset such as just less than the forward bias voltage of the body diode of second power switch 222. In certain examples, the detection circuit of the first and second body diode conduction sensors 223, 224 can include a differential amplifier, a comparator, or a combination thereof.

In certain applications, when the non-overlapping time is very small, the delays of the first body diode conduction sensor 223 or the second body diode conduction sensor 224 can fail to trigger the output signals (I_POS, I_NEG). For example, if the first body diode conduction sensor 223 fails to trigger the first output signal (I_NEG), the power stage 102 can continue operate in, for example, the buck mode while the load current is negative in polarity from the output voltage ($V_{OUT}$) to the output node (SW). In such a situation, when the low side, or second power switch 222 turns on and a reverse over current event occurs, the low side power transistor 222 can turn off and the voltage at the output node (SW) node can rise to above the voltage at the first power supply rail ($V_{IN}$). The first body diode conduction sensor 223 can detect the rise in voltage of the output node (SW) and can trigger the output (I_NEG) to change the mode of operation from buck to boost. In a similar fashion, second body diode conduction sensor 224 can change the mode of the power stage 102 from boost to buck when the second output signal (I_POS) fails to trigger when the non-overlapping time is very small.

Figure 3:
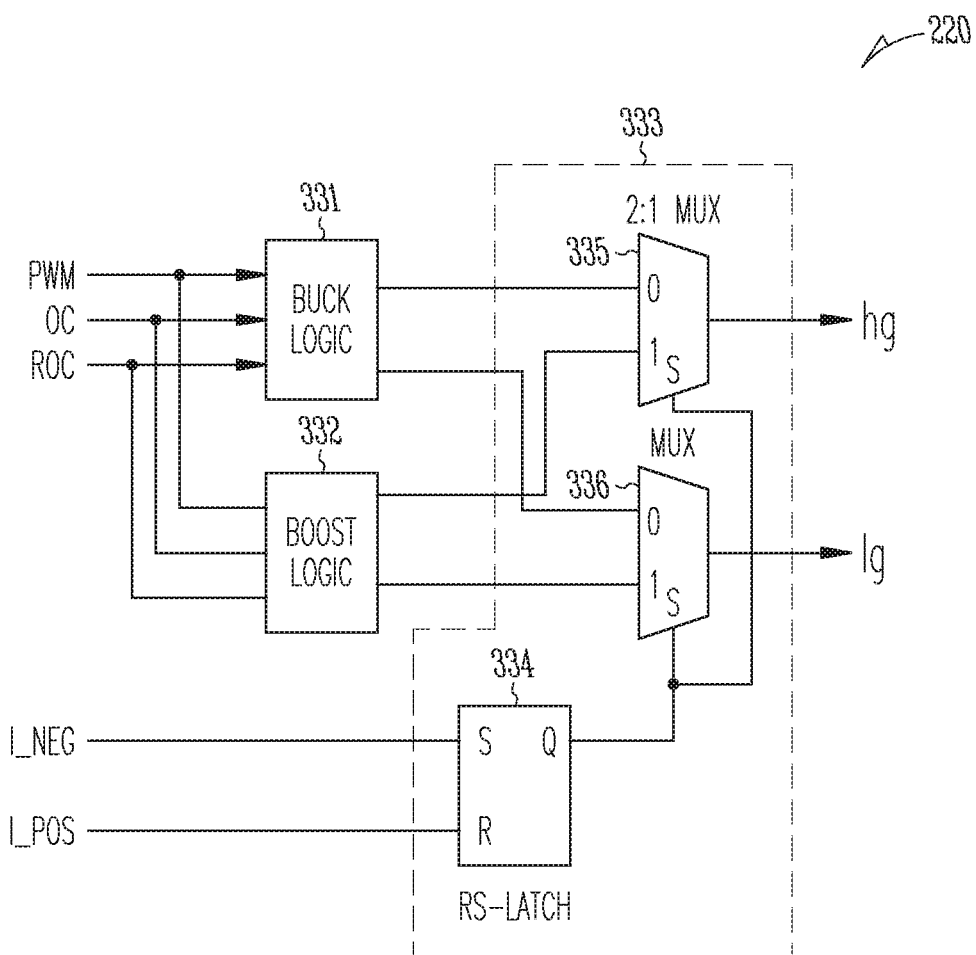
FIG. 3 illustrates generally an example controller according to the present subject matter.

FIG. 3 illustrates generally an example controller 220 that utilizes the body diode conduction sensors (FIG. 2; 223, 224) and the over-current signals (OC, ROC) of the current comparator (FIG. 2; 225) to transition between the modes discussed above and operate the voltage converter more efficiently which, in turn, especially for monolithic power stages, can provide for better reliability. The controller 220 can include switching logic 331 for the first mode of operation, switching logic 332 for the second mode of operation and logic 333 to transition between the first and second modes of operation. In certain examples, the logic 333 for transitioning between the first and second modes of operation can include a flip-flop 334 and first and second multiplexers 335, 336. The flip-flop 334 can receive the output (I_NEG, I_POS) of the each of the first and second body diode conduction sensors. The output of the flip-flop 334 can be received at the control input of each multiplexer 335, 336 to allow the output of the corresponding switching logic 331, 332 to control the first and second power switches via a corresponding signal (hg, lg) of the controller.

In an example, assume the output of the flip-flop is logic "low" (e.g., Q=0) and the first and second power switches are controlled by the switching logic 331 for the first mode of operation. In such a condition, an output signal (I_POS) from the second body diode conduction sensor can generally be ignored as positive current is generally desired during the first mode of operation. The first body diode conduction sensor can provide an active output signal (I_NEG) when the output voltage of the converter is above the voltage of the first supply rail. In certain examples, the output signal (I_NEG) does not become active until the output voltage of the converter is a first threshold above the voltage of the first supply rail. Such a condition can be an indication that current flow at the output of the converter is negative, or flowing from the load to the converter, for example, because the load is generating a higher voltage than the voltage of the first supply rail. Such a condition can also be an indication that the body diode of the first power switch is, or is about to be, forward biased. In response to the active output signal (I_NEG) of the first body diode conduction sensor, the flip-flop 334 can change states, or be set (e.g., Q=1). The logic "high" of the flip-flop output (Q) can allow the multiplexers 335, 336 to isolate the control nodes (hg, lg) of the power switches from the switching logic 331 of the first mode of operation and couple the control nodes (hg, lg) of the power switches to the switching logic 332 for the second mode of operation.

With the power switches coupled to, and operating according to, the switching logic 332 for the second mode of operation, an output signal (I_NEG) from the first body diode conduction sensor can generally be ignored, as negative current is generally assumed during the second mode of operation. The second body diode conduction sensor can provide an active output signal (I_POS) when the output voltage of the converter is below the voltage of the second supply rail. In certain examples, the output signal (I_POS) does not become active until the output voltage of the converter is a second threshold below the voltage of the supply rail. Such a condition can be an indication that current flow at the output of the converter is positive, or flowing from the converter to the load, for example, because the load is consuming current at a lower voltage than the voltage of the first supply rail. Such a condition can also be an indication that the body diode of the second power switch is, or is about to be, forward biased. In response to the active output signal (I_POS) of the second body diode conduction sensor, the flip-flop 334 can change states, or be reset (e.g., Q=0), by the active output signal (I_POS) of the second body diode conduction sensor. The logic "low" of the flip-flop output (Q) can allow the multiplexers 335, 336 to isolate the control nodes (hg, lg) of the power switches from the switching logic 332 of the second mode of operation and couple the control nodes (hg, lg) of the power switches to the switching logic 331 for the first mode of operation.

In certain examples, the first mode of operation can be analogous to operating the converter as a buck converter such that the first switch is triggered by the PWM signal, the duty cycle of the first switch is limited by the PWM signal, and the second switch is responsive to the first switch and is used as a rectifier. In the second mode of operation, the converter is operated analogous to a boost converter such that the second switch is triggered by the PWM signal, the duty cycle of the second switch is limited by the PWM signal, and the first switch is responsive to the second switch and is used as a rectifier.

Figure 4A:
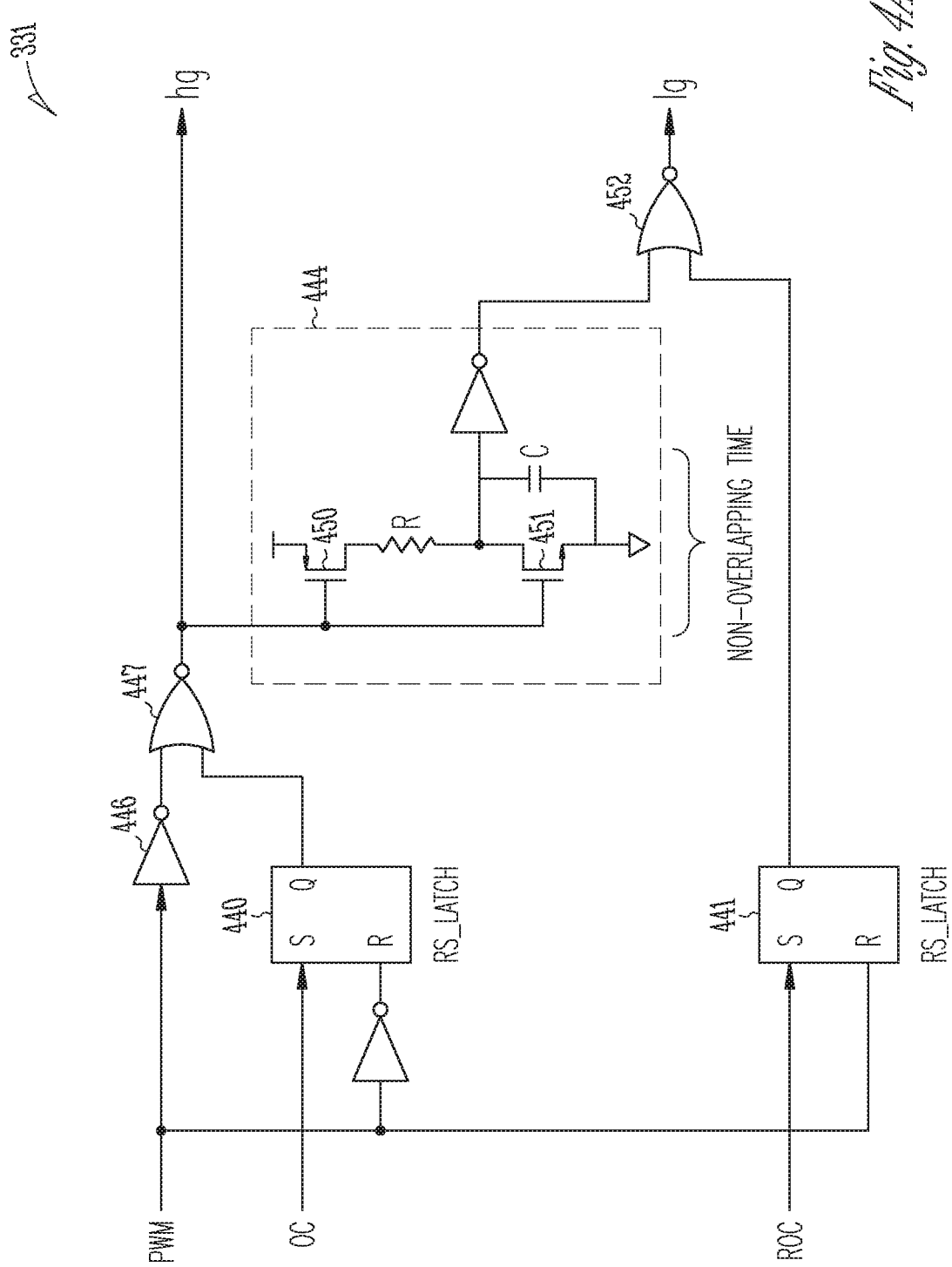
FIGS. 4A and 4B illustrate generally example switching logic for the first and second modes of operation.
Figure 4B:
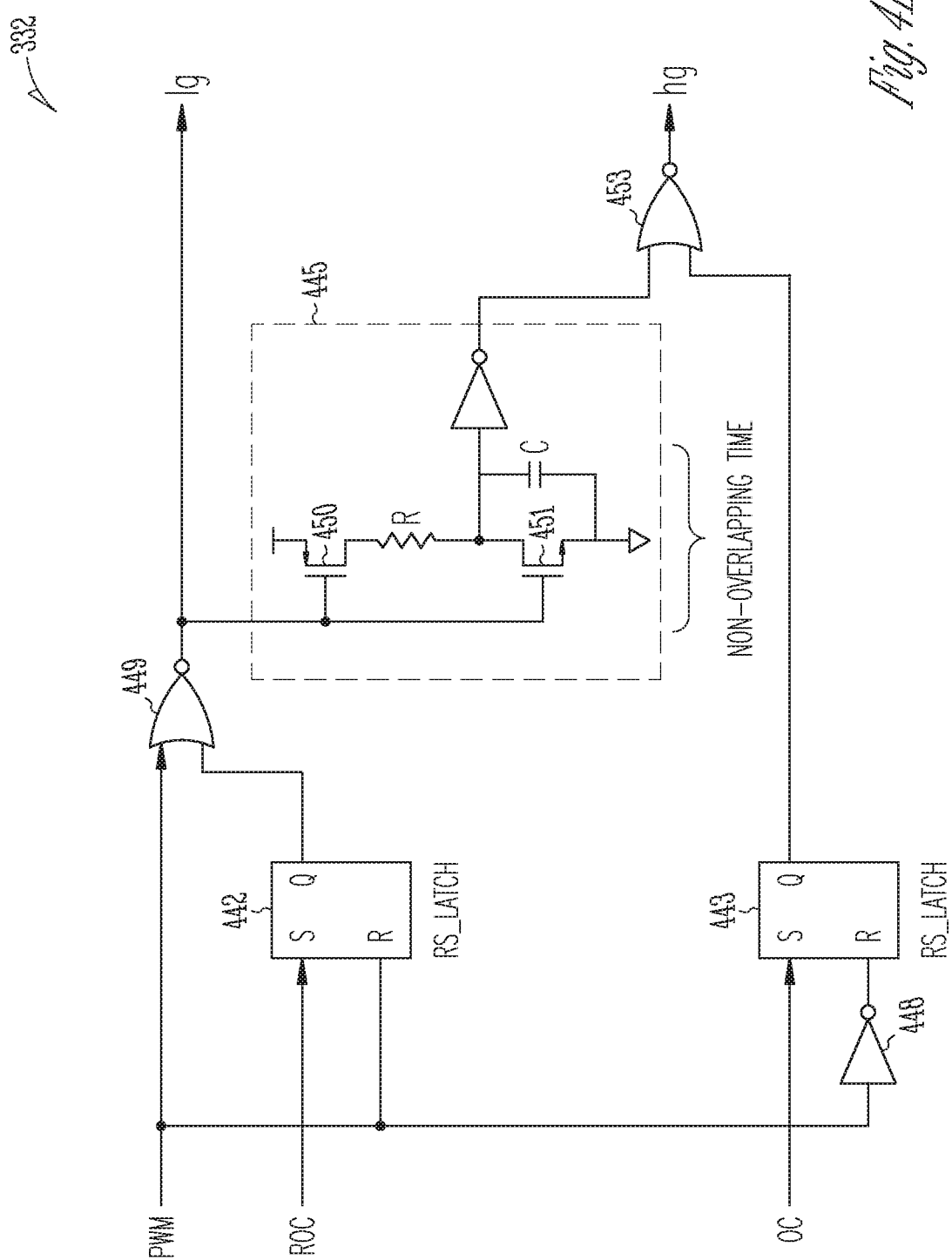
Figure 5A:
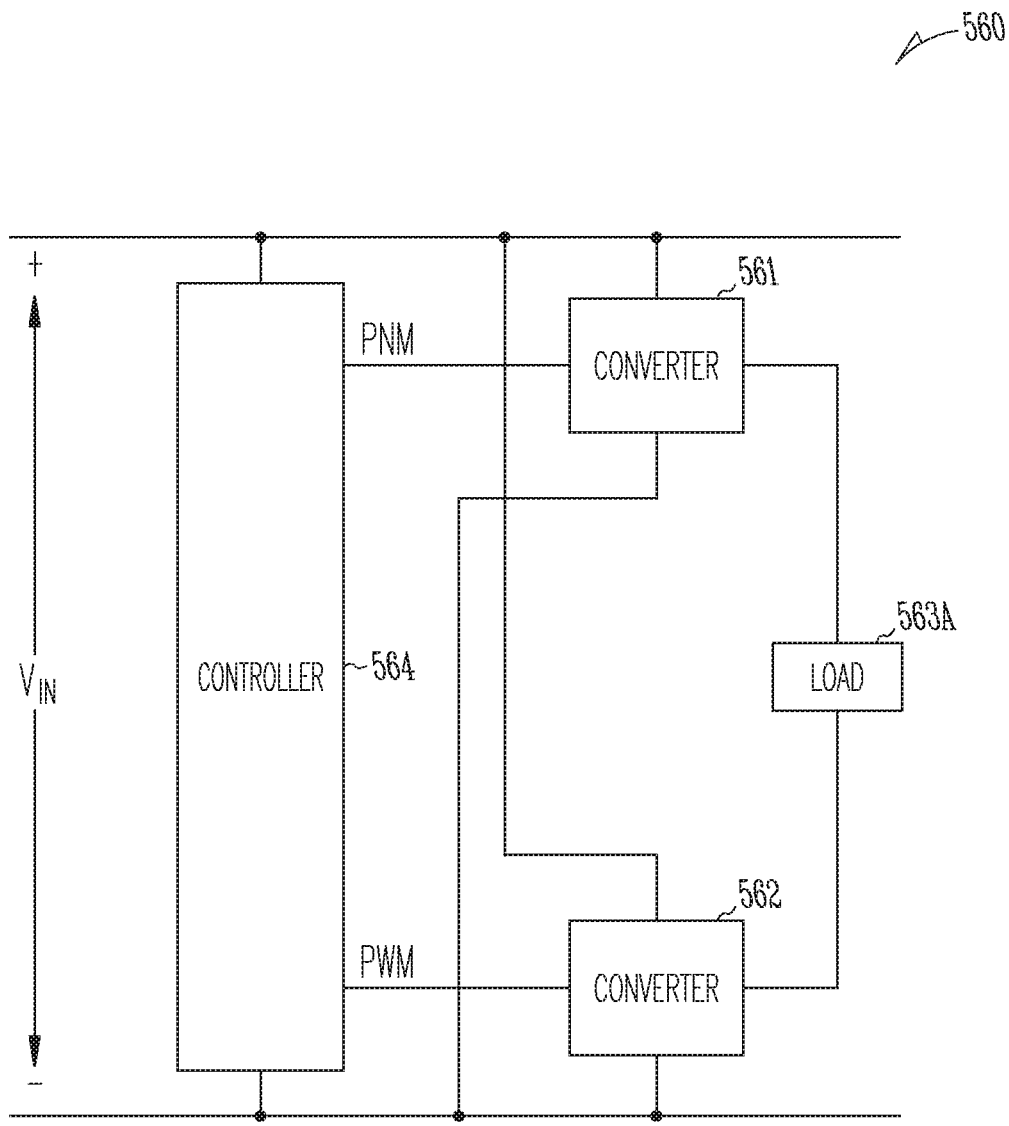
FIG. 5A illustrates an example system including a load differentially driven using two example power converters according to the preset subject matter.
Figure 5B:
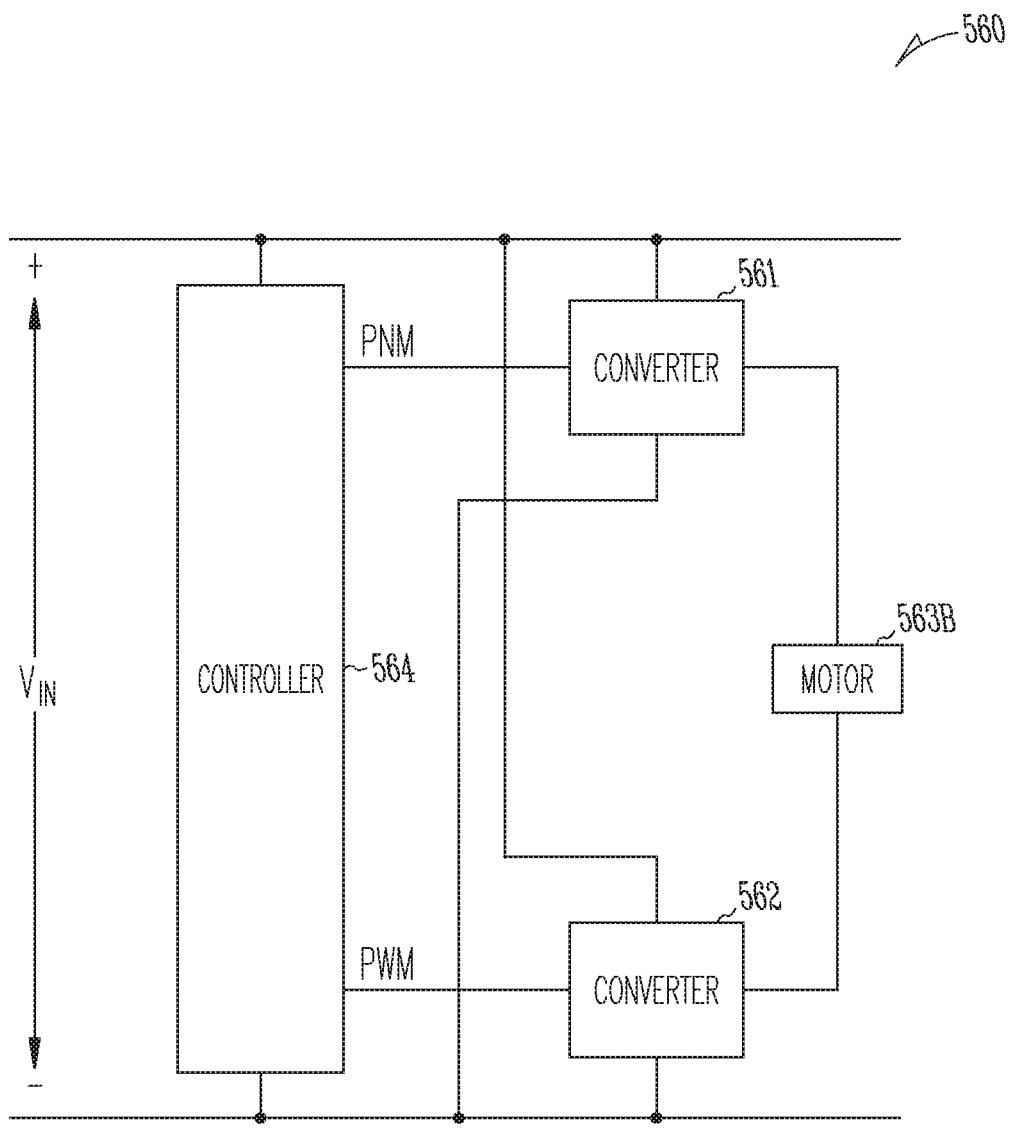
FIG. 5B illustrates an example system including a motor differentially driven using two example power converters according to the preset subject matter.
Figure 5C:
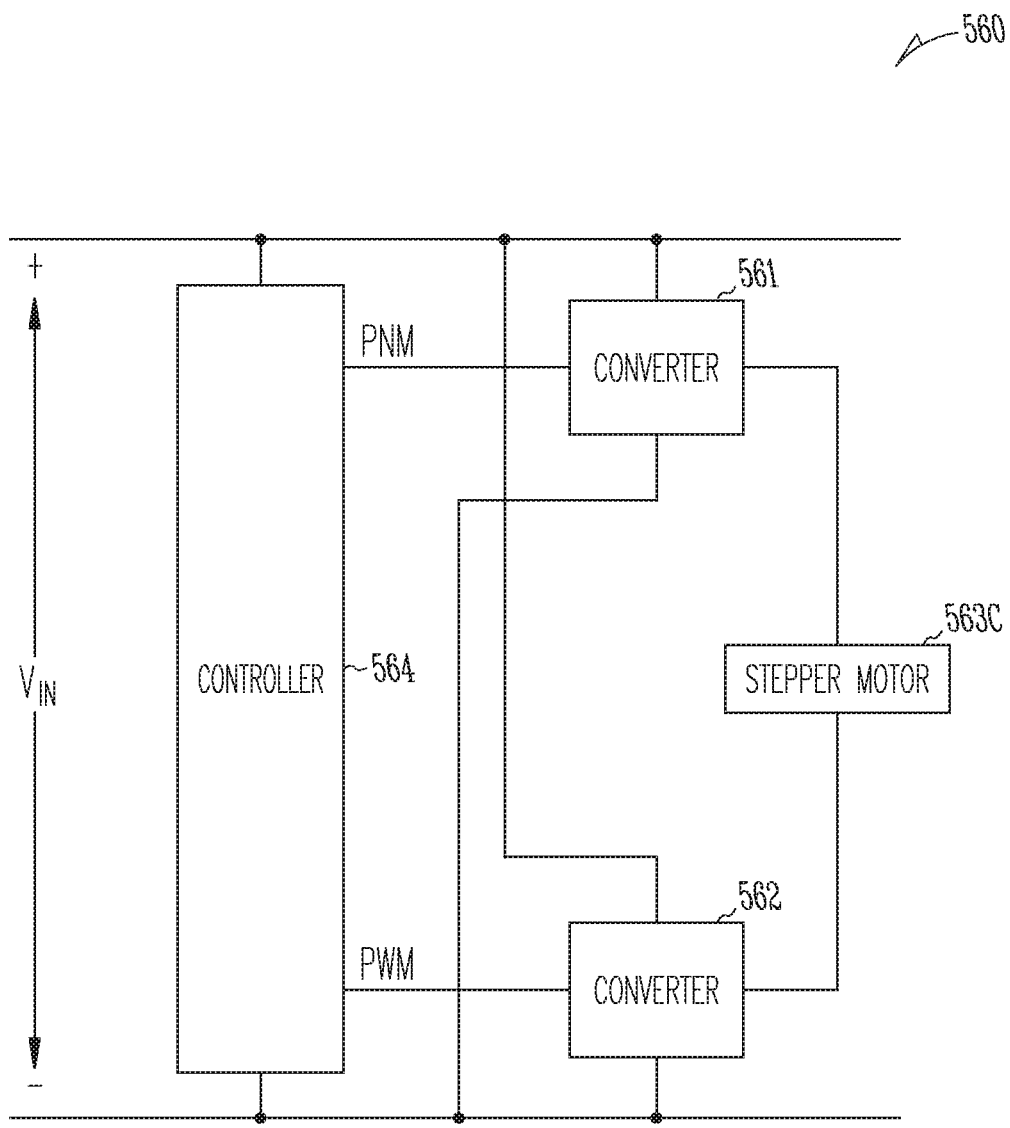
FIG. 5C illustrates an example system including a stepper motor differentially driven using two example power converters according to the preset subject matter.
Figure 5D:
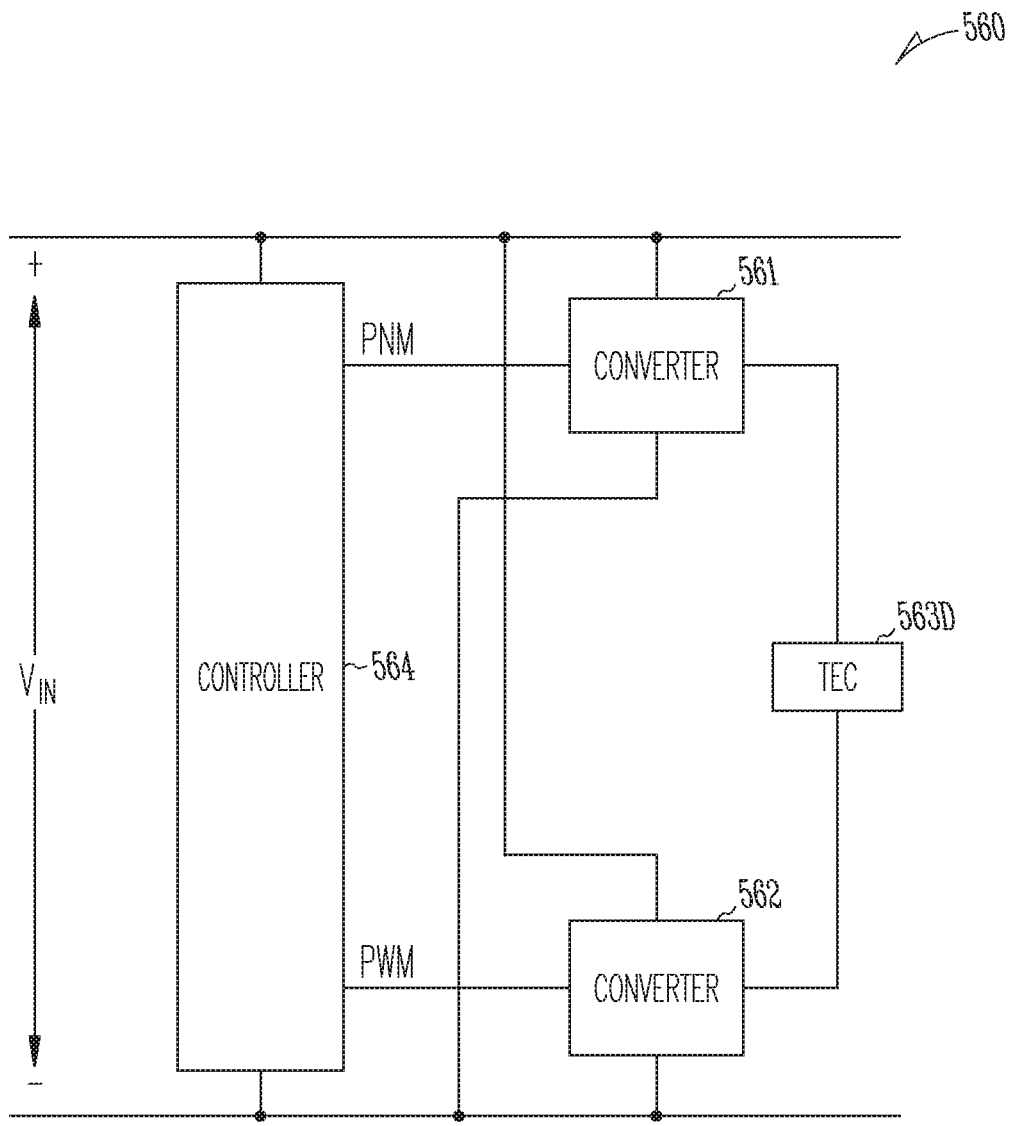
FIG. 5D illustrates an example system including a thermoelectric device differentially driven using two example power converters according to the preset subject matter.

FIGS. 4A and 4B illustrate generally example switching logic 331, 332 for the first and second modes of operation, respectively. Each switching logic circuit 331, 332 can receive the PWM signal, and the overcurrent signals (OC, ROC) from the current comparator (FIG. 2; 225). Each switching logic circuit 331, 332 can include first and second flip-flops 440, 441, 442, 443, optional delay circuits 444, 445, and various other logic gates 446, 447 to condition the logic signals to properly set the respective power switch output (hg, lg). The switching logic 331, 332 assumes that the first and second power switches assume a low-impedance state when their respective control node, or output of the switching logic, is at a logic "high" and a high-impedance state when their respective control node is at a logic "low". It is understood that the impedance state of the first a second power switches can be different without departing from the scope of the present subject matter. Assuming the positive over-current signal (OC) and the negative over-current signal (ROC) are at a logic "low" and have been there for a long time, the switching circuit 331 for the first mode of operation places the output (hg) for the first power switch to assume a low-impedance state directly in response to the PWM signal transitioning from a "low" logic level to a "high" logic level via a first inverter 446 and first NOR gate 447. Conversely, the switching circuit 332 for the second mode of operation places the output (lg) for the second power switch to assume a low-impedance state directly in response to the PWM signal transitioning from a "high" logic level to a "low" logic level via a second NOR gate 449.

Each switching circuit 331, 332 can optionally include a delay circuit 444, 445 to create a delay between the PWM triggered switch exiting the low-impedance state and the other switch entering the low-impedance state. As the respective switch exits the low-impedance state, a delay network including a resistor (R) and capacitor (C) can begin to charge the capacitor via a p-type transistor 450 coupling the delay network to a voltage source ($V_{IN}$). As the voltage across the capacitor (C) reaches a "high" logic level, the output controlling the other switch can transition to a logic "high", placing the other switch in the low-impedance state. An n-type transistor 451 can be used to discharge the capacitor (C) when the output for the PWM triggered switch is set to a "high" logic level.

FIG. 4A includes a first flip-flop 440 configured to receive the PWM signal and the positive over-current limit signal (OC), and to provide an output to an NOR-gate 447 controlling the output (hg) to the first power switch. The positive over-current signal (OC) is provided by the current comparator and indicates the direction of the inductor current and that the inductor current is greater than a predefined current limit. In combination with the first flip-flop 447, the positive over-current limit signal (OC) can interrupt the low-impedance state of the first power switch when the controller is operating in the first mode of operation and the first power switch is in a low impedance state. Such a function can protect the first power switch from stress associated with passing more current than the switch is designed to pass.

FIG. 4A includes a second flip-flop 441 configured to receive the PWM signal and the negative over-current signal (ROC), and to provide an output to a first NOR-gate 452 controlling the output (lg) to the second power switch. The negative over-current limit signal (ROC) is provided by the current comparator and indicates the direction of the inductor current and that the inductor current is greater than a predefined current limit. In combination with the second flip-flop 441, the negative over-current limit signal (ROC) can interrupt the low-impedance state of the second power switch when the controller is operating in the first mode of operation and the second power switch is in a low-impedance state. Such a function can protect the second power switch from stress associated with passing more current than the switch is designed to pass.

FIG. 4B includes a first flip-flop 442 configured to receive the PWM signal and the negative over-current limit signal (ROC), and to provide an output to a first NOR-gate 449 controlling the output (lg) for the second power switch. In combination with the first flip-flop 442, the negative over-current limit signal (ROC) can interrupt the low-impedance state of the second power switch when the controller is operating in the second mode of operation and the second power switch is in a low-impedance state. Such a function can protect the second power switch from stress associated with passing more current than the switch is designed to pass.

FIG. 4B includes a second flip-flop 443 configured to receive the PWM signal and the positive over-current limit signal (OC), and to provide an output to a second NOR-gate 453 controlling an output (hg) for the first power switch. In combination with the second flip-flop 443, the positive over-current limit signal (OC) can interrupt the low-impedance state of the first power switch when the controller is operating in the second mode of operation and the first power switch is in a low-impedance state. Such a function can protect the first power switch from stress associated with passing more current than the switch is designed to pass.

FIGS. 5A-5D illustrate generally example systems 560 including a load 563A, 563B, 563C. 563D differentially driven using two power converters 561, 562 according to the preset subject matter. The system 560 can include a system controller 564, a first voltage converter 561, a second voltage converter 562, and the load 563A. In certain examples, the load 563A can include, but is not limited to, a motor 563B, a stepper motor 563C, a thermoelectric device (TEC) 563D, or combinations thereof. The power converters 561, 562 are particular suited to differentially driving the load 563A as the control scheme discussed above can allow each power converter 561, 562 to efficiently source or sink current as the controller 564 requests or as the application demands. In addition to sourcing and sinking current, the control scheme places each converter 561, 562 into a switching mode of operation that can protect the power switches of each converter 561, 562 from over current stress and that can efficiently conduct current via a power switch channel rather than a body diode when such a situation is detected. Such situations can arise when a setpoint of the system controller 564 changes rapidly, or when disturbances of the load environment are encountered.

Figure 6:
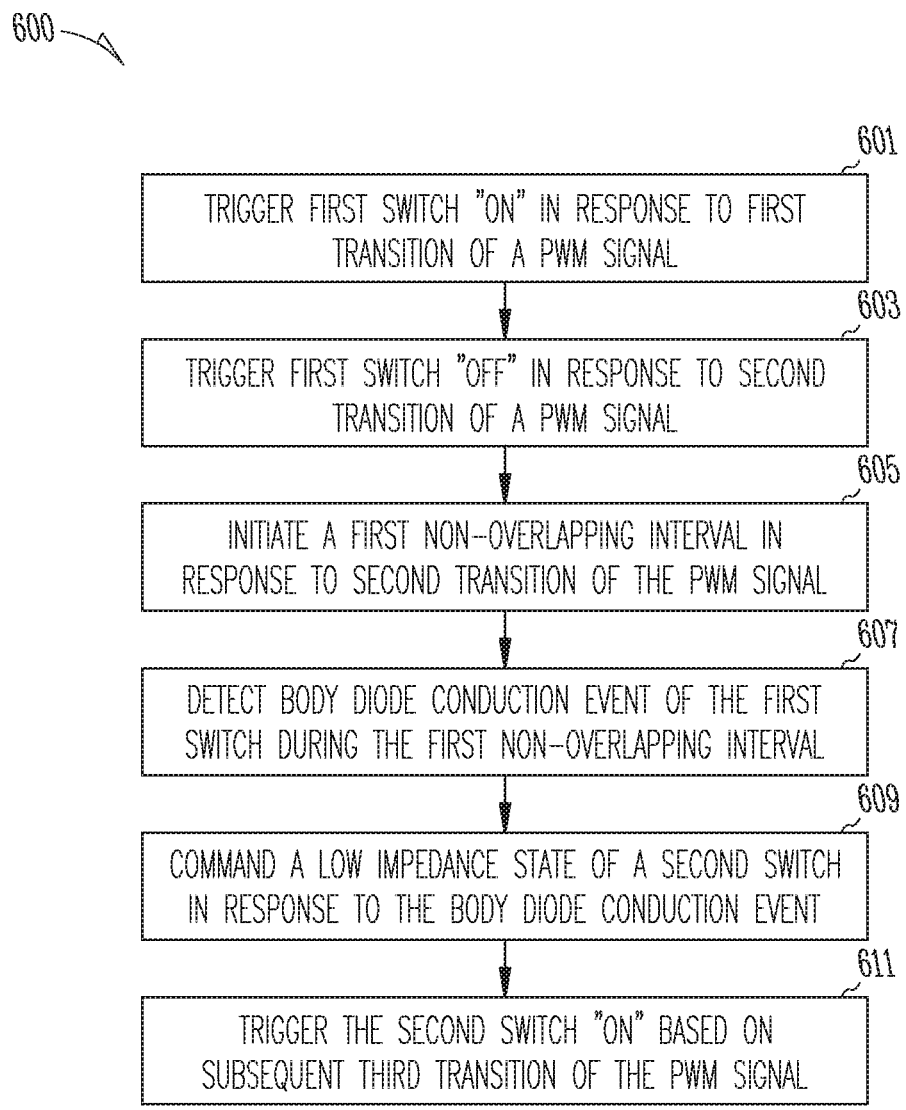
FIG. 6 illustrates generally a flowchart of an example method of operating a power stage according to the present subject matter.

FIG. 6 illustrates generally a flowchart of an example method of operating a power stage according to the present subject matter. At 601, a first switch of a power stage can be triggered "on" in response to a first transition of a PWM signal. The power stage can include the first switch coupled in series with a second switch between rails of an input voltage supply. At 603, the first switch can be triggered "off" in response to a second transition of the PWM signal. At 605, a first non-overlapping interval can be initiated in response to the "off" state of the first switch. In certain examples, the "on" time of the switch that is directly responsive to the transition of the PWM signal is the basis of the duty cycle of the power stage, and that switch is the actively controlled switch. The actively controlled switch turns "on" only once during each switching period and does not turn "on" any longer than the prescribed duty cycle. If a maximum current limit is detected, the actively controlled switch can be turned "off" before the expiration of the interval defined by the duty cycle. The switch that is not actively controlled, can be turned "on" in response to the actively controlled switch turning "off" or the expiration of a non-overlapping interval. As used herein, a "maximum current limit" can include either a maximum positive current limit or maximum negative current limit and may be referenced to the ratings of the actively controlled switch.

At 607, a body diode conduction sensor can monitor the first switch, or the actively controlled switch and, in certain situations, detect body diode conduction event of the first switch during the first non-overlapping interval. In certain examples, detection of the body diode conduction event can include comparing a voltage across the actively controlled switch to a reference voltage. Depending on which switch of the first and second switches is actively controlled, the reference voltage can be near one of the input voltage supply rails or a small offset from the potential at one of the input voltage supply rails. At 609, in response to the body diode conduction event, the second switch can be placed "on", or in a low-impedance state. The low-impedance state of the second switch can more efficiently divert current of the system and pull the voltage of the common node between the first and second switch to a more desired level than allowing the current to be diverted via the body diode of the first switch. In addition, the second switch can become the actively controlled switch and, at 611, can be triggered to an "on" state directly in response to a third transition of the PWM signal. Thus, the power stage can change a mode of operation of a power stage to more efficiently control current.

In certain examples, the ability of the power stage to change the operating mode, for example, via changing the actively controlled switch, the power stage is better able to divert excess or unexpected current via a channel of one of the switches rather than a body diode of one of the switches. Using the channel of one of the switches can dissipate much less heat than using a body diode of one of the switches. Less heat can equate to less stress and a more reliable power stage especially a monolithic power stage integrated circuit (IC), or a monolithic buck converter IC.

Various Notes & Examples

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, the terms "including" and "comprising" are open-ended, that is, a system, device, article, composition, formulation, or process that includes elements in addition to those listed after such a term are still deemed to fall within the scope of subject matter discussed. Moreover, such as may appear in a claim, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of a claim. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. The following aspects are hereby incorporated into the Detailed Description as examples or embodiments, with each aspect standing on its own as a separate embodiment, and it is contemplated that such embodiments can be combined with each other in various combinations or permutations.

What is claimed is:

1. A method for operating a switching circuit having a first switch configured to couple to a first supply rail, a second switch configured to couple to a second supply rail and a switch node coupling the first switch in series with the second switch, and an inductor coupled between the switch node and a load, the method comprising:
   triggering a first low-impedance state of the first switch on a first transition of a pulse-width modulated (PWM) signal from a first logic level to a second logic level;
   triggering a first high impedance state of the first switch on a second transition of the PWM signal from the second logic level to the first logic level;
   initiating a first non-overlapping interval in response to the second transition;
   detecting a body diode conduction event of the first switch during the first non-overlapping interval;
   commanding a first low-impedance state of the second switch in response to the body diode conduction event of the first switch; and
   triggering the second switch to a first high-impedance state based on a subsequent third transition of the PWM signal from the first logic level to the second logic level.

2. The method of claim 1, including triggering a second low-impedance state of the second switch on a subsequent fourth transition of the PWM signal from the second logic level to the first logic level.

3. The method of claim 2, including, when the second switch is in the second low-impedance state after the fourth transition,
- detecting a negative maximum current limit event when the current of the inductor violates a maximum negative current limit;
- commanding a second high-impedance state of the second switch in response to the negative maximum current limit event; and
- commanding a second low-impedance state of the first switch in response to the negative current limit event.

4. The method of claim 1, including:
- triggering a second high-impedance state of the second switch on a fourth transition of the PWM signal from the first logic level to the second logic level;
- initiating a second non-overlapping interval in response to the fourth transition;
- detecting a body diode conduction event of the second switch during the second non-overlapping interval; and
- triggering the first switch to a second high-impedance state based on a subsequent fifth transition of the PWM signal from the first logic level to the second logic level.

5. The method of claim 4, triggering a second low-impedance state of the first switch on a subsequent sixth transition of the PWM signal from the first logic level to the second logic level.

6. The method of claim 5, including, when the first switch is in the second low-impedance state after the sixth transition,
- detecting a positive maximum current limit event when the current of the inductor violates a maximum positive current limit;
- commanding a third high-impedance state of the first switch in response to the positive current limit event; and
- commanding a second low-impedance state of the second switch in response to the positive current limit event.

7. A power stage circuit for a switched-mode converter, the power stage comprising:
- a first detector circuit to receive a signal indicative of body diode conduction of a first power transistor, the first power transistor to couple a first supply node to an intermediate node;
- a second detector circuit to receive a signal indicative of body diode conduction of a second power transistor, the second power transistor to couple a second supply node to the intermediate node;
- an output node to feed a load from an inductor, the inductor coupled between the output node and the intermediate node; and
- a controller configured to operate the first and second power transistors to avoid body diode conduction through the first and second power transistors, the controller comprising:
  - first switching logic for a first mode of operation; and
  - second switching logic for a second mode of operation;
  - wherein the controller is communicatively coupled to the first and second detector circuits; and
  - wherein in response to a body diode conduction event indication for the first or second power transistor, control nodes of the first and second power transistors are isolated from one of the first switching logic and the second switching logic.

8. The power stage circuit of claim 7, further comprising a multiplexer circuit configured to couple the controller to the first and second detector circuits, wherein the multiplexer circuit is configured to selectively isolate the control nodes of the first and second power transistors from one of the first switching logic or the second switching logic depending on the mode of operation.

9. The power stage circuit of claim 7, including a current comparator configured to receive a representation of output current of the output node, to compare the representation of output current to one or more maximum current limits to provide one or more maximum current limit comparisons, and to provide an indication of each maximum current limit comparison to the controller.

10. The power stage circuit of claim 9, wherein the controller is configured to:
- trigger a first low-impedance state of the first power transistor on a first transition of a PWM signal from a first logic level to a second logic level using the first switching logic;
- trigger a first high impedance state of the first power transistor on a second transition of the PWM signal from the second logic level to the first logic level using the first switching logic;
- initiate a first non-overlapping interval in response to the second transition using the first switching logic;
- receive the first body diode conduction event indication of the first power transistor during the first non-overlapping interval from first detector circuit;
- couple the control nodes of the first and second power transistors to second switching logic using a multiplexer in response to the first body diode conduction event indication; and
- trigger the second power transistor to a first high-impedance state based on a subsequent third transition of the PWM signal from the first logic level to the second logic level using the second switching logic.

11. The power stage circuit of claim 10, wherein the controller is configured to trigger a second low-impedance state of the second switch on a subsequent fourth transition of the PWM signal from the second logic level to the first logic level using the second switching logic;
- wherein, in response to the second low-impedance state of the second switch after the fourth transition, the controller is configured to:
- receive a negative maximum current limit indication from the current comparator in response to current of the output violating a maximum negative current limit;
- command a second high-impedance state of the second switch in response to the negative maximum current limit indication using the second switching logic; and
- command a second low-impedance state of the first switch in response to the negative current limit indication using the second switching logic.

12. The power stage circuit of claim 1, wherein the controller is configured to:
- trigger a second high-impedance state of the second switch on a fourth transition of the PWM signal from the first logic level to the second logic level using the second switching logic;
- initiate a second non-overlapping interval in response to the fourth transition using the second switching logic;
- receive a second body diode conduction indication of the second switch during the second non-overlapping interval from a second body diode conduction sensor coupled across the second power transistor;

isolate control nodes of the first and second power transistors from the second switching logic using the multiplexer in response to the body diode conduction event of the second power transistor;

couple the control nodes of the first and second power transistors to the first switching logic using another multiplexer in response to the body diode conduction event of the first power transistor; and trigger the first switch to a second high-impedance state based on a subsequent fifth transition of the PWM signal from the first logic level to the second logic level.

13. The power stage circuit of claim 12, wherein the controller is configured to trigger a second low-impedance state of the first switch on a subsequent sixth transition of the PWM signal from the first logic level to the second logic level using the first switching logic; and wherein, in response to the second low-impedance state of the first switch after the sixth transition, the controller is configured to:

receive a positive maximum current limit indication from the current comparator in response to the current of the output node violating a maximum positive current limit;

command a third high-impedance state of the first switch in response to the positive current limit indication using the first switching logic; and command a second low-impedance state of the second switch in response to the positive current limit indication using the first switching logic.

14. The power stage circuit of claim 7, wherein a monolithic, integrated circuit includes the first power transistor, the second power transistor, the output node, and the controller.

15. A system including:

a first voltage converter including a switching circuit having a first switch configured to couple to a first supply rail, a second switch configured to couple to a second supply rail and a switch node coupling the first switch in series with the second switch and an inductor coupled between the switch node and an output; and wherein a controller of the first voltage converter includes:

means for triggering a low-impedance state of the first switch on a first transition of a first PWM signal from a first logic level to a second logic level;

means for triggering a high impedance state of the first switch on a second transition of the first PWM signal from the second logic level to the first logic level;

means for initiating a first non-overlapping interval in response to the second transition;

means for detecting a body diode conduction event of the first switch during the first non-overlapping interval;

means for commanding a low-impedance state of the second switch in response to the body diode conduction event of the first switch; and means for triggering the second switch to a high-impedance state based on a subsequent third transition of the first PWM signal from the first logic level to the second logic level.

16. The system of claim 15, wherein the controller further includes means for triggering a second low-impedance state of the second switch on a subsequent fourth transition of the PWM signal from the second logic level to the first logic level.

17. The system of claim 16, including, when the second switch is in the second low-impedance state after the fourth transition, means for detecting a negative maximum current limit event when the current of the inductor violates a maximum negative current limit;

means for commanding a second high-impedance state of the second switch in response to the means for detecting the negative maximum current limit event; and means for commanding a second low-impedance state of the first switch in response to the means for detecting the negative current limit event.

18. The system of claim 15, including a second voltage converter coupled to the output.

19. The system of claim 18, wherein the output is coupled to a motor.

20. The system of claim 18, wherein the output is coupled to a thermoelectric device.

* * * * *